United States Patent [19]

Hnatuck et al.

[11] Patent Number: 4,900,258

[45] Date of Patent: Feb. 13, 1990

[54] MULTI-PORT COAXIAL PRINTED CIRCUIT BOARD CONNECTOR

[75] Inventors: Robert J. Hnatuck, Mechanicsburg; Thomas S. Cohen; Dimitry G. Grabbe, both of Middletown, all of Pa.

[73] Assignee: AMP Incorporated, Harrisburg, Pa.

[21] Appl. No.: 365,069

[22] Filed: Jun. 12, 1989

[51] Int. Cl.[4] ............ H05K 1/00

[52] U.S. Cl. ............ 439/63; 439/65; 439/79; 439/581; 439/502

[58] Field of Search ............ 439/48, 50–53, 439/578–585, 610, 609, 502, 512, 63, 79, 78, 65

[56] References Cited

U.S. PATENT DOCUMENTS

| | | | |
|---|---|---|---|
| 3,825,874 | 7/1974 | Peverill | 439/579 |
| 4,273,407 | 6/1981 | Snuffer | 439/581 |
| 4,548,453 | 10/1985 | Mummey et al. | 439/578 |
| 4,792,312 | 12/1988 | Yasumoto | 439/578 |
| 4,813,886 | 3/1989 | Roos et al. | 439/578 |

FOREIGN PATENT DOCUMENTS

| | | | |
|---|---|---|---|
| 0273589 | 7/1988 | European Pat. Off. | 439/63 |

OTHER PUBLICATIONS

"Crushed Tubing Coaxial Connector", H. C. Schick IBM Technical Disclosure Bulletin vol. 7, No. 1, 6/1974 pp. 91, 92.

*Primary Examiner*—David Pirlot

[57] ABSTRACT

A connector assembly (28) for mounting a daughter board (20) on a mother board (66) and providing electrical connections therebetween. The connector assembly (28) is made up of a housing (74) mounted on the daughter board (20), a plurality of coaxial cable subassemblies (30), a faceplate member (76) and a cover member (78). The cable subassemblies (30) are held in the housing (74) with their two ends in positions corresponding to contact positions on the daughter board (20) and the mother board (66), with the cable subassemblies (30) being arranged to make a right angle turn. The faceplate member (76) includes a shroud portion (102) which surrounds contact assemblies (38) adapted for matingly engaging corresponding contact assemblies in a housing block (70) which is part of connector assembly (68) mounted on the mother board (66). The shroud portion (102) is sized to surround and frictionally engage the housing block (70). The cover member (78) of the connector assembly (28) is configured to position and hold the cable subassemblies (30) so as to protect them from rough handling or accidental shunting.

22 Claims, 5 Drawing Sheets

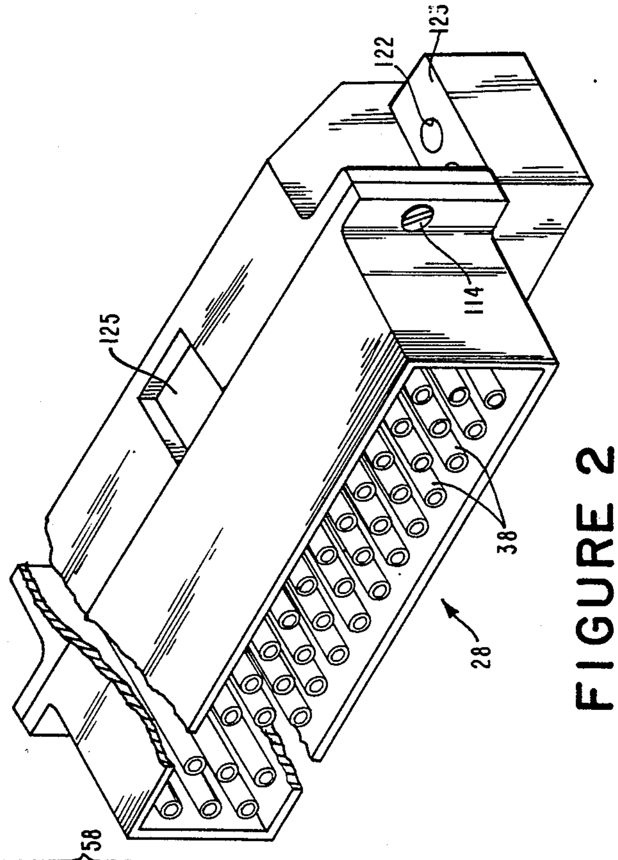
FIGURE 2
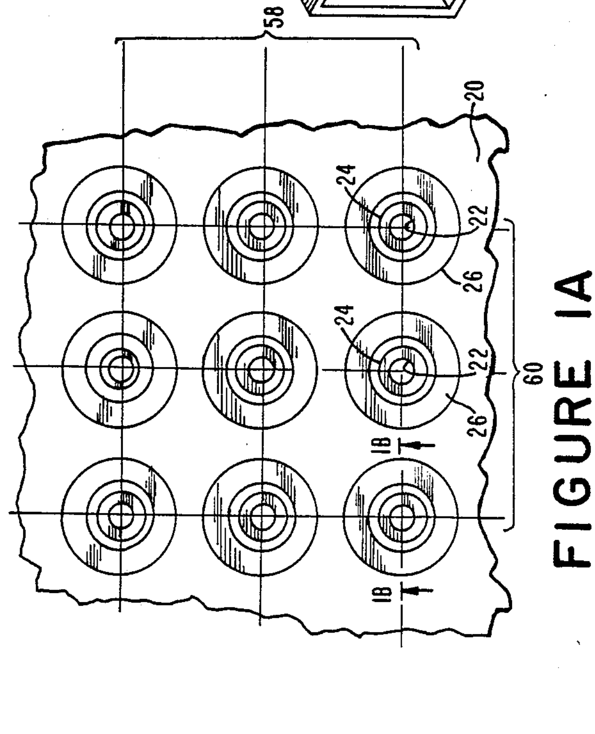
FIGURE IA
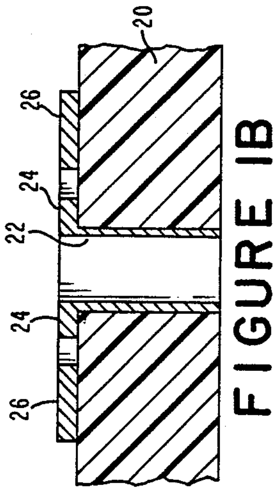
FIGURE IB

MULTI-PORT COAXIAL PRINTED CIRCUIT BOARD CONNECTOR

BACKGROUND OF THE INVENTION

This invention relates to printed circuit board connectors and, more particularly, to an improved multiport coaxial connector assembly system for separably interconnecting two printed circuit boards.

With the ever increasing speed of computer circuitry, new problem are encountered. The increased speed comes about from a reduction of the size of the semiconductor components, such as IC gates, and results in faster signal rise times to produce more electromagnetic radiation from signal carrying conductors. As semiconductor component size is reduced, the components become more sensitive to noise and cross talk. This interference problem has in the past been solved by surrounding the signal carrying pin connected to the printed circuit board by other pins. These other pins are connected to ground to provide a "return path" for radiated signals so as to provide shielding. This traditional shielding method is uneconomical because four to eight pins may be required per signal to provide cross talk and noise immunity, impacting upon the space available on the printed circuit board.

A connector assembly which addresses the problems of shielding and connector density is disclosed in co-pending U.S. patent application Ser. No. 07/297,636, filed Jan. 13, 1989, assigned to the assignee of the present invention. This co-pending application discloses a connector assembly for use with a printed circuit board wherein a true coaxial connection is provided. The connector assembly includes a housing block with a plurality of bores aligned with the plated-through apertures of the circuit board. Each of the bores contains a coaxial connector subassembly which provides surface contact with the signal pads and ground pads surrounding the apertures on the printed circuit board. As disclosed in the aforereferenced co-pending application, individual wire terminations may be made to th printed circuit board through the connector assembly. What s desired, in addition, is an arrangement whereby a large number of connections may be made to the printed circuit board through the connector assembly. In particular, it would be desirable to have an arrangement wherein the connector assembly disclosed in the aforereferenced co-pending application is mounted on one printed circuit board (sometimes referred to as a mother board) and another printed circuit board (sometimes referred to as a daughter board) may be mechanically and electrically connected to the one printed circuit board through the aforereferenced connector assembly.

It is therefore an object of this invention to provide a signal connector compatible with the aforedescribed connector to provide a "system" approach for connecting daughter boards to mother boards.

It is another object of this invention to provide a connector assembly wherein the signal path through the interconnection minimizes reflections to thereby minimize degradation of the signal wave form.

It is a further object of this invention to provide a connector assembly with relatively distortionless interconnection for signal waveforms with significant harmonics up to ten GHz.

It is yet another object of this invention to provide a connector assembly wherein no cross talk is induced in the connector assembly and which it is immune to electromagnetic interference, from both a radiative and susceptibility standpoint (i.e., wherein the connector is inherently shielded).

It is yet a further object of this invention to provide a connector assembly of high density interconnection, eliminating the need for adjacent pin groundings.

It is still another object of this invention to provide a connector assembly mountable to a printed circuit board without requiring soldering or exposing the board to severe thermal shock, so that the connector assembly is separable from the printed circuit board.

It is still a further object of this invention to provide a connector assembly allowing the use of isolated grounds if required by the particular application.

SUMMARY OF THE INVENTION

The foregoing and additional objects are attained in accordance with the principles of this invention by providing a connector assembly made up of a housing, a faceplate member, a cover member and a plurality of coaxial cable subassemblies . The housing has a base portion and a wall portion, the base portion being formed with through-bores in a two dimensional array defined by the intersection of a first set of parallel lines and a second set of parallel lines transverse to the first set. The wall portion is substantially planar and extends from the base portion from a region outside the array of through-bores parallel to the through-bores and parallel to the first set of lines. The wall portion has a plurality of parallel slots open at the distal end of the wall portion, each of the slots being aligned with a respective line in the second set of lines. The coaxial cable subassemblies are each terminated at both ends with a respective coaxial contact assembly. The contact assemblies at the first ends of the cable subassemblies are each disposed in respective ones of the through-bores of the housing base portion and the second ends of the cable subassemblies are each disposed in respective slots aligned with the line of the second set of lines which corresponds to the through-bore in which the contact assembly at the first end of that cable subassembly is disposed. The faceplate member includes a wall formed with apertures positioned in a two dimensional array corresponding to the positions of the second cable subassembly ends disposed in the slots of the housing wall portion. The cover member includes means for holding the cable subassemblies. There is further provided as part of the assembly, means for securing the faceplate member to the cover member with the housing wall portion therebetween so that the contact assemblies at the second end of the cable subassemblies extend through respective ones of the apertures in the faceplate member wall.

In accordance with an aspect of this invention, the faceplate member is formed with a shroud portion which extends from the faceplate member wall in a direction away from the housing wall portion and surrounds the contact assemblies in the apertures in the faceplate member wall.

In accordance with another aspect of this invention, the cover member holding means includes a substantially planar wall transverse to the housing wall portion which is formed with a plurality of open ended slots aligned with lines in the second set of lines corresponding to the through-bores in the housing base portion.

BRIEF DESCRIPTION OF THE DRAWINGS

The foregoing will be more readily apparent upon reading the following description in conjunction with the drawings in which like elements in different figures thereof have the same reference numeral and wherein:

FIG. 1A illustrates a typical circuit board pattern for a true coaxial connection;

FIG. 1B is a cross-sectional view taken along the line 1B—1B in FIG. 1A;

FIG. 2 is a perspective view of a connector assembly constructed in accordance with the principles of this invention;

DETAILED DESCRIPTION

Figure 3:
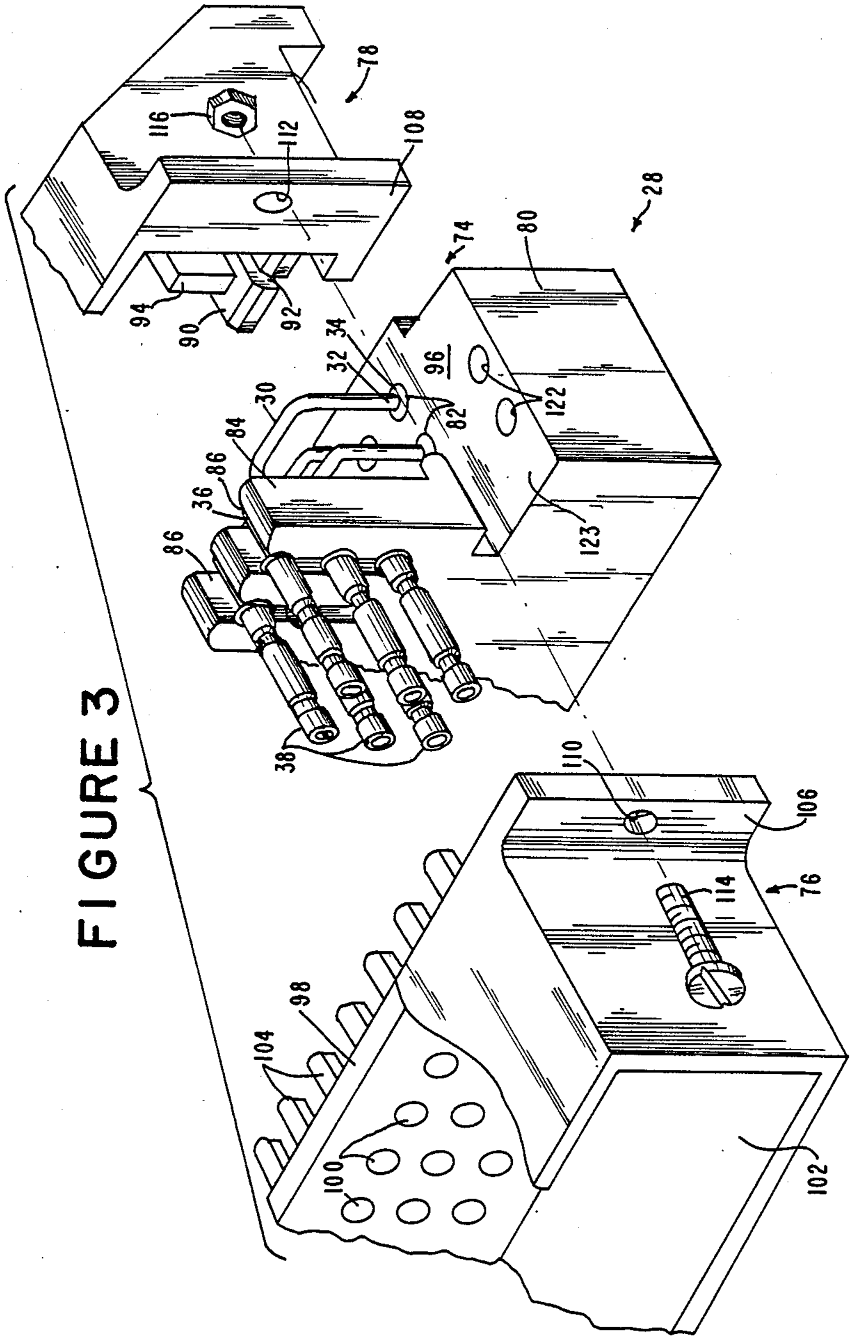
FIG. 3 is an exploded perspective view of the connector assembly shown in FIG. 2.

Referring to the drawings, FIGS. 1A and 1B show a printed circuit board 20 with a conductive pattern for coaxial connections. Thus, there are a plurality of internally plated apertures 22 surrounded by signal pads 24 in electrical contact with the aperture plating. Surrounding and spaced from the signal pads 24 are a plurality of conductive ground pads 26, each individual to a respective one of the apertures 22 and signal pads 24.

FIG. 2 shows a connector assembly, designated generally by the reference numeral 28, constructed in accordance with the principles of this invention and adapted to be mounted on the printed circuit board 20 in electrical contact with the pads 24 and 26. In a preferred embodiment, the connector assembly 28 is designed as a right angle connector and is made up of a number of parts. The signal transmission media is coaxial cable, preferably 50 ohm semi-rigid cable 30 formed so as to minimize discontinuities caused by the 90° transition from one end to the other. The cable 30 is terminated at a first end 32 with a first coaxial contact assembly 34 and at a second end 36 with a second coaxial contact assembly 38.

Figure 5:
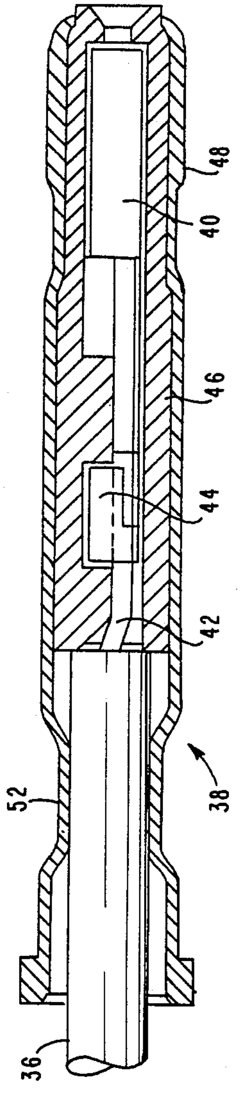
FIG. 5 is a longitudinal cross-sectional view of an illustrative coaxial contact assembly for terminating the second ends of the coaxial cable subassemblies.
Figure 6:
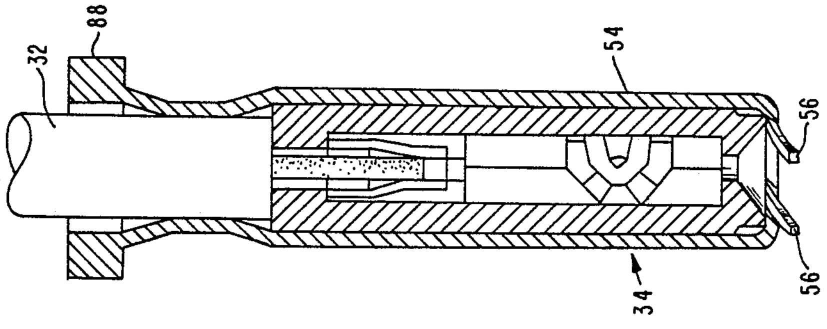
FIG. 6 is a longitudinal cross-sectional view of an illustrative coaxial contact assembly for terminating the first ends of the coaxial cable subassemblies.

The coaxial contact assembly 38 (FIG. 5) utilizes a center contact 40 that is attached to the signal conductor 42 of the cable 30. A wire termination slot 44 is provided on the tail of the contact 40 for ease of positioning the signal conductor 42 prior to attachment. The terminated signal contact 40 is then surrounded by a dielectric housing 46 which insulates the signal from the outer contact 48 and fixes its position inside the outer contact. The outer contact 48 is then slid over the dielectric housing 46 and crimped down or soldered at 52 over the outer diameter of the cable 30 to provide intimate contact between the outer contact 48 and the outer shield of the cable 30. FIG. 6 illustrates the first coaxial contact assembly 34 which is similar to the second coaxial contact assembly 38, described above. The contact assembly 34 is designed for surface contact with the pad 26 on the printed circuit board 20. Accordingly, a first difference between the contact assembly 34 and the contact assembly 38 is that the contact assembly 34 has been shortened to keep the overall height of the connector assembly 28 above the printed circuit board 20 to a minimum. The second difference is that the portion of the outer contact 54 of the contact assembly 34 that touches the ground pads 26 has grounding fingers 56 which make contact with a respective ground pad 26. Accordingly, each signal has its own isolated ground. End users can then determine which grounds, if any, will be made common depending on how the printed circuit board artwork is laid out.

As previously discussed, the connector assembly according to this invention functions for providing coaxial connections between first and second pluralities of contact positions, preferably mounted on a daughter board and a mother board. As illustrated in FIG. 1A, the first plurality of contact positions is arranged in a first substantially planar two dimensional array defined by the intersections of a first set of parallel lines 58 and a second set of parallel lines 60 transverse to the first set 58. Preferably, the first and second sets of lines are orthogonal to each other. The second plurality of contact positions (FIG. 8) are arranged in a second substantially planar two dimensional array defined by the intersection of a third set of parallel lines 62 and a fourth set of parallel lines 64 transverse to the third set 62. Preferably, the third and fourth sets of parallel lines are also orthogonal to each other. Also, the planes of the first and second pluralities of contact positions are substantially orthogonal to each other. In the preferred embodiment, as show in FIG. 8, the printed circuit board 20 (the daughter board) is orthogonal to the printed circuit board 66 (the mother board) having the second array thereon.

Figure 8:
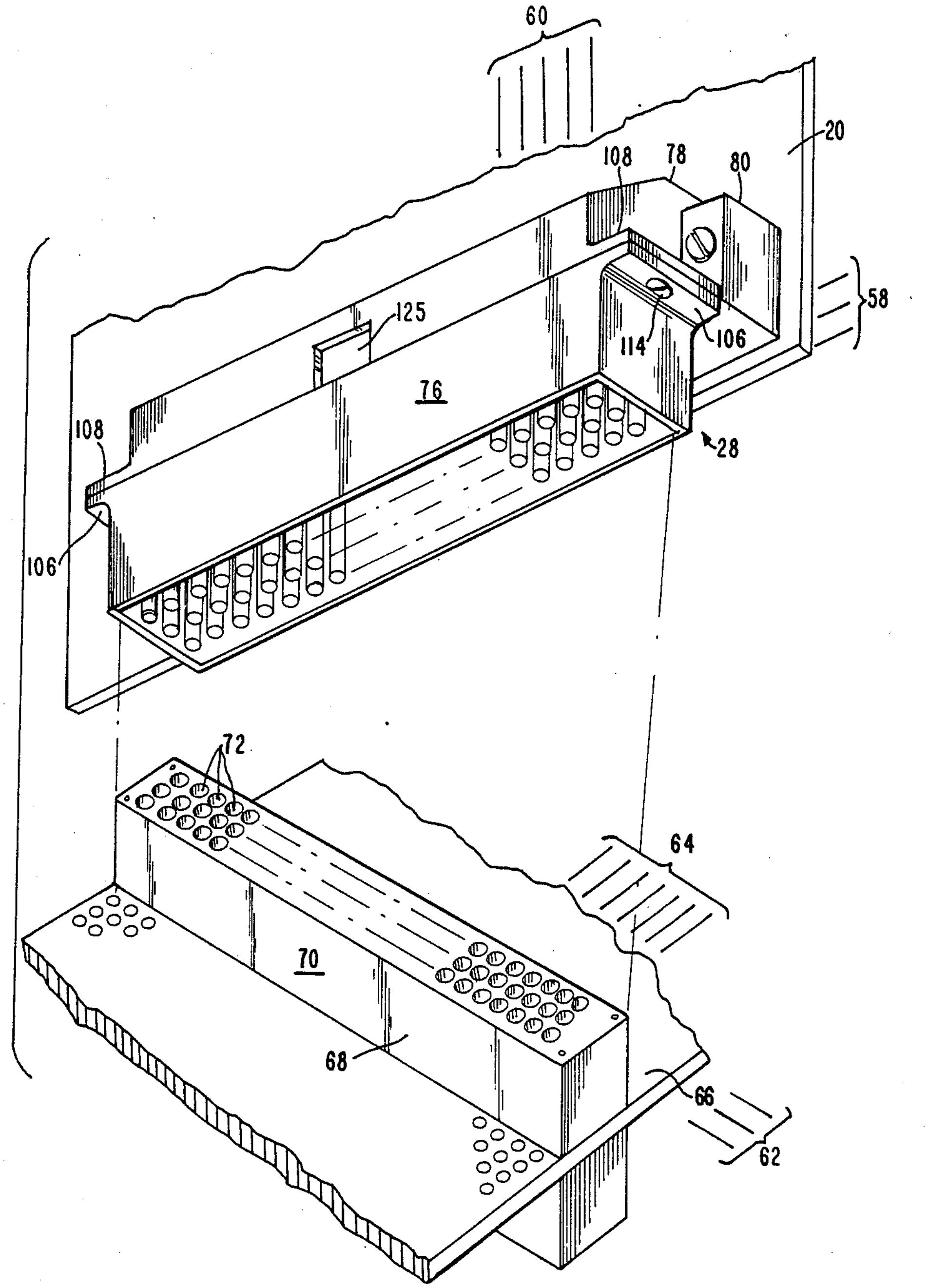
FIG. 8 illustrates the use of the connector assembly shown in FIG. 2 for separably mounting a daughter board on a mother board.

FIG. 8 illustrates the printed circuit board 66 having mounted thereon a connector assembly 68 of the type disclosed in the aforerereferenced co-pending application. The connector assembly 68 includes a housing block 70 with a plurality of bores 72 aligned with the contact positions at the intersections of the third set of parallel lines 62 and the fourth set of parallel lines 64. Each of the bores 72 contains a coaxial connector subassembly (not shown) which provides surface contacts with the signal pads and ground pads of the contact positions of the second array.

The connector assembly 28 mounted on the printed circuit board 20 is designed to matingly engage the connector assembly 68 on the printed circuit board 66 so as to mount the printed circuit board 20 to the printed circuit board 66 and at the same time provide electrical connections between the contact positions in the first and second arrays. As is shown in the drawings, the connector assembly 28 includes a housing 74, a faceplate member 76 and a cover member 78. The housing 74 has a base portion 80 which is formed with a plurality of through-bores 82 in a two dimensional array corresponding to the first array on the printed circuit board 20. The housing 74 is also formed with a wall portion 84 which is substantially planar and extends away from the base portion 80 from a region outside the array of through-bores 82. The wall portion 84 is parallel to the through-bores 82 and is also parallel to the first set of parallel lines 58. Formed in the wall portion 84 is a plurality of parallel slots 86 which are open at the distal end of the wall portion 84. Each of the slots 86 is aligned with a respective line in the second set of parallel lines 60 so that it corresponds with a line of the through-bores 82.

Figure 4:
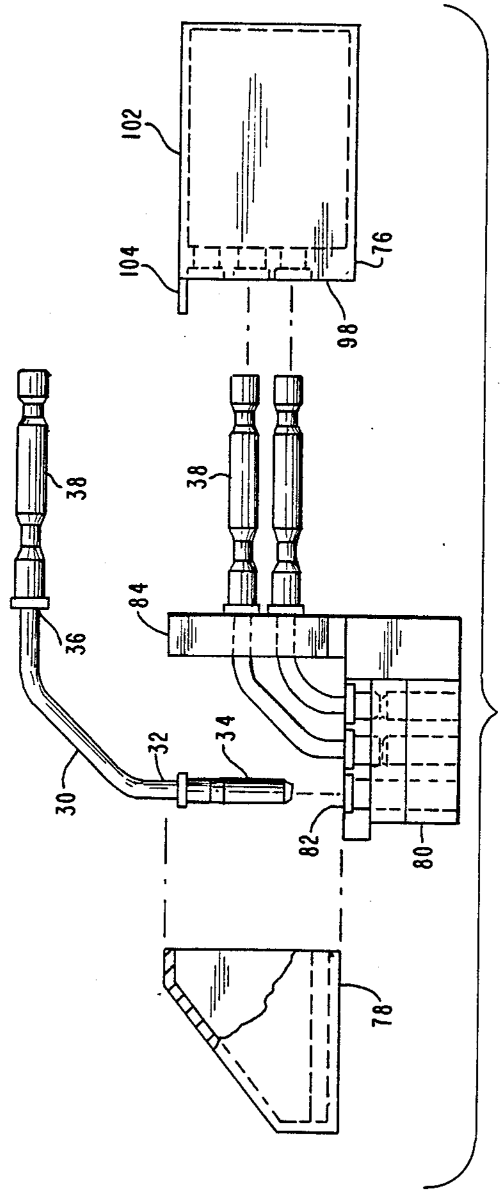
FIG. 4 is an exploded elevational view, partially cut away, of the connector assembly shown in FIG. 2.
Figure 7:
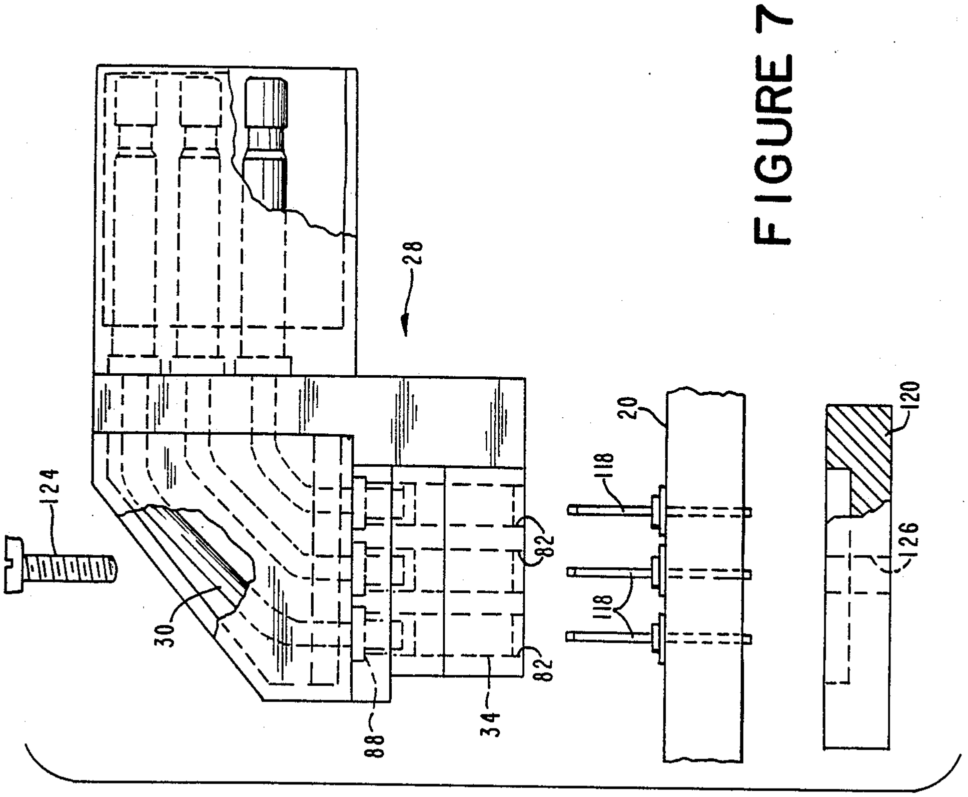
FIG. 7 illustrates the mounting of the connector assembly shown in FIG. 2 to a printed circuit board.

The through-bores 82 are counterbored, as shown in FIGS. 4 and 7, and into each of the bores 82 there is inserted a respective coaxial contact assembly 34 which terminates a first end 32 of a coaxial cable subassembly 30. The head 88 of the contact assembly 34 fits in the counterbored portion of the respective through-bore 82. As the contact assembly 34 is seated in its respective through-bore 82, the second end 36 of the cable subassembly 30 is inserted into one of the slots 86, in particular, that slot which is aligned with the line in the array of through-bores 82 in which the particular through-bore holding the contact assembly 34 is positioned. As is clear from the drawings, the coaxial cable subassembly 30 is of appropriate length so that a shorter cable length is used for the cable which is in a through-bore 82 closer to the wall portion 84 and accordingly lower in a slot 86.

After the cable subassemblies 30 are positioned in respective through-bores 82 and slots 86, the cover member 78 is slid into place. The cover member 78 is formed with means for holding the cable subassemblies 30. This holding means includes a substantially planar wall 90 which is transverse to the wall portion 84 of the housing 74. The wall 90 is formed with a plurality of open ended slots 92 which are aligned with the lines in the second set of lines 60 corresponding to the array of the through-bores 82. Between the slots 92, the wall 90 is formed with a plurality of ribs 94, as shown in FIG. 3, which ribs extend substantially parallel to the slots 92. Thus, when the cover member 78 is slid onto the housing 74, the wall 90 rests on the upper surface 96 of the base portion 80 with the cables 30 disposed in respective slots 92, and with lines of cables 30 being separated by the ribs 94. The width of the slots 92 is smaller than the diameter of the through-bores 82, thereby interfering with the heads 88 of the contact assemblies 34, while providing slight clearance for the cables 30. Therefore, the wall 90 functions to prevent the contact assemblies 34 from backing out of the through-bores 82 when the connector assembly 28 is assembled to the printed circuit board 20. Additionally, the cooperation between the slots 92 and the ribs 94 protects the cables 30 from rough handling or accidental shunting therebetween.

The faceplate member 76 includes a wall 98 formed with apertures 100 in a two dimensional array corresponding to the position of the second cable ends 36 disposed in the slots 86 of the housing wall portion 84. Upon assembly, the faceplate member 76 is moved toward the housing wall portion 84 from the side opposite the cover member 78 so that the contact assemblies 38 extend through respective ones of the apertures 100 in the wall 98. The faceplate member 76 is further formed with a shroud portion 102 which extends from the wall 98 in a direction away from the housing wall portion 84 and surrounds the contact assemblies 38 disposed in the apertures 100. The shroud portion 102 is of appropriate size to surround and frictionally engage the housing block 70 of the connector assembly 68 mounted on the printed circuit board 66. The components of the faceplate member' 76 must also be so dimensioned with respect to the housing block 70 of the connector assembly 68 that when the shroud portion 102 surrounds the housing block 70, the apertures 100 of the faceplate member wall 98 are aligned with the bores 72 of the housing block 70. The faceplate member 76 is also provided with a plurality of fingers 104 extending from the wall 98 and configured to close the slots 86 of the housing wall portion 84 after the contact assemblies 38 are fully inserted in the apertures 100.

For securing the connector assembly 28, the faceplate member 76 is formed with flanges 106 extending from opposite ends thereof and the cover member 78 is formed with similar flanges 108 extending from opposite ends thereof. Upon assembly of the connector assembly 28, as described above, the housing wall portion 84 will be between the faceplate member 76 and the cover member 78, with the flanges 106 in surface abutment with the flanges 108. To secure the connector assembly 28, all that need be done is clamp the flanges 106 to the flanges 108. Illustratively, such clamping is effected by providing an opening 110 in each of the flanges 106 and an opening 112 in each of th flanges 108. The openings 110, 112 are so positioned on the respective flanges 106 108 that upon assembly of the connector assembly 28, the openings 110 align with respective openings 112. Accordingly, fasteners may be inserted through the openings 110, 112. Illustratively, these fasteners may include a bolt 114 and a nut 116, as shown in FIG. 3, or a rivet, not shown. Once the connector assembly 28 is assembled together, as described above, it must be attached to the printed circuit board 20. Preferably, this is accomplished by way 1 of a field of pins 118 (FIG. 7), illustratively of the type described in U.S. Pat. No. 4,186,982. Thus, the pins 118 are staked onto the printed circuit board 20 through the apertures 22 in contact with the signal pads 24, and do not require any soldering. Since each of the contact assemblies 34 has three grounding fingers 56 each applying pressure to the printed circuit board 20 as the connector assembly 28 is attached, and since a typical connector assembly 28 includes 120 contact assemblies 34 in a 3×40 array, a board stiffener 120 is preferably utilized on the underside of the printed circuit board 20 opposite the connector assembly 28 to balance the forces and minimize warpage of the printed circuit board 20. Thus, the housing base portion 80 is formed with openings 122 in shoulders 123 at opposite ends thereof, as shown in FIG. 3, and in the center in alignment with an opening 125 in the cover member 78, as shown in FIGS. 2 and 8. These openings 122 are sized to receive the screws 124. Aligned openings are provided in the printed circuit board 20 and the screws 124 are then threadedly engaged with threaded openings 126 in the board stiffener 120.

Thus, after the connector assembly 28 is fully assembled and attached to the printed circuit board 20, as shown in FIG. 8, it may be used to mechanically mount the printed circuit board 20 onto the printed circuit board 66 with electrical connections between contact positions on both boards.

There has thus been described an improved connector assembly system for interconnecting two printed circuit boards. While a preferred embodiment has been disclosed, it will be apparent to one of ordinary skill in the art that various modifications and adaptations to the disclosed arrangement can be made without departing from the spirit and scope of this invention, which is only intended to be limited by the appended claims.

We claim:

1. An assembly (28) for providing coaxial connections between first and second pluralities of contact positions, said first plurality of contact positions being arranged in a first substantially planar two dimensional array defined by the intersections of a first set (58) of parallel lines and a second set (60) of parallel lines transverse to said first set (58), said second plurality of contact positions being arranged in a second substantially planar two dimensional array defined by the intersections of a third set (62) of parallel lines and a fourth set (64) of parallel lines transverse to said third set (62), with the planes of said first and second pluralities of contact positions being substantially orthogonal to each other, said assembly (28) comprising:

a housing (74) having a base portion (80) and a wall portion (84), said base portion (80) being formed with through-bores (82) in a two dimensional array corresponding to said first array, said wall portion (84) being substantially planar and extending from said base portion (80) from a region outside said array of throughbores (82) parallel to said through-bores (82) and parallel to said first set (58) of lines, said wall portion (84) having a plurality of parallel slots (86) open at the distal end of said wall portion (84), each of said slots (86) being aligned with a respective line in said second set (60) of lines;

a plurality of coaxial cable subassemblies (30) each terminated at both ends with a respective coaxial contact assembly (34, 38), the contact assemblies (34) at the first ends (32) of said cable subassemblies (30) each being disposed in a respective one of said through-bores (82) and the second ends (36) of said cable subassemblies (30) each being disposed in a respective slot (86) aligned with the line of the second set (60) of lines corresponding to the through-bore (82) in which the contact assembly (34) at the first end (32) of that cable subassembly (30) is disposed;

a faceplate member (76) including a wall (98) formed with a plurality of apertures (100) arranged in a two dimensional array corresponding to the positions of the second cable subassembly ends (36) disposed in the slots (86) of the housing wall portion (84);

a cover member (78) including means (90) for holding the cable subassemblies (30); and means (106, 108, 110, 112, 114, 116) for securing said faceplate member (76) to said cover member (78) with said housing wall portion (84) therebetween so that the contact assemblies (38) at the second ends (36) of the cable subassemblies (30) extend through respective ones of the apertures (100) in the faceplate member wall (98).

2. An assembly according to claim 1 wherein said faceplate member (76) is formed with a shroud portion (102) extending from said faceplate member wall (98) in a direction away from said housing wall portion (84) and surrounding the contact assemblies (38) in the apertures (100) in the faceplate member wall (98).

3. An assembly according to claim 2 wherein said faceplate member (76) is formed with a plurality of fingers (104) extending transverse to said faceplate member wall (98) and adapted to close the ends of said housing wall portion slots (86).

4. An assembly according to claim 1 wherein said cover member holding means (90) includes a substantially planar wall (90) transverse to said housing wall portion (84) and formed with a plurality of open ended slots (92) aligned with lines in the second set (60) of lines corresponding to the through-bores (82) in the housing base portion (80).

5. An assembly according to claim 4 wherein said cover member wall (90) is formed with a plurality of ribs (94) parallel to said slots (92), with at least one of said ribs (94) being disposed between every adjacent pair of said slots (92).

6. An assembly according to claim 4 wherein the width of each of said slots (92) is less than the diameter of said through-bores (82) and greater than the diameter of said cable subassemblies (30).

7. An assembly according to claim 1 wherein said securing means includes flanges (106, 108) formed on the faceplate member (76) and the cover member (78), and means (110, 112, 114, 116) for clamping the flanges (106, 108) to each other.

8. An assembly according to claim 7 wherein said clamping means includes aligned openings (110, 112) in the flanges (106, 108) and fasteners (114) extending through said aligned openings (110, 112).

9. An assembly according to claim 1 wherein said first plurality of contact positions includes a plurality of contact pads (24) on a surface of a printed circuit board (20), the assembly further including means (120, 124) for mounting said housing (74) on said board with said base portion through-bores (82) in alignment with said contact pads (24).

10. An assembly according to claim 1 wherein said first (58) and second (60) sets of lines are substantially orthogonal to each other.

11. An assembly according to claim 1 wherein said third (62) and fourth (64) sets of lines are substantially orthogonal to each other.

12. An assembly according to claim 1 wherein said first (58) and second (60) sets of lines are substantially orthogonal to each other and said third (62) and fourth (64) sets of lines are substantially orthogonal to each other 13. A connector assembly (28) mounted on a first printed circuit board (20) for separably connecting a first plurality of contact pads (24) on a surface of said first printed circuit board (20) and arranged in a first array defined by the intersections of transverse first (58) and second (60) coplanar sets of parallel lines to a second plurality of contact pads on a surface of a second printed circuit board (66) and arranged in a second array defined by the intersections of transverse third (62) and fourth (64) coplanar sets of parallel lines, said second printed circuit board (66) having mounted thereon a connector (68) including a housing block (70) with through-bores (72) aligned with said second array and coaxial contact assemblies in said through-bores matingly engaged with respective ones of said second plurality of contact pads, said connector assembly comprising:

a housing (74) having a base portion (80) and a wall portion (84), said base portion (80) being formed with through-bores (82) in a two dimensional array corresponding to said first array, said wall portion (84) being substantially planar and extending from said base portion (80) from a region outside said array of throughbores (82) parallel to said through-bores (82) and parallel to said first set (58) of lines, said wall portion (84) having a plurality of parallel slots (86) open at the distal end of said wall portion (84), each of said slots (86) being aligned with a respective line in said second set (60) of lines;

means (120, 124) for mounting said housing (74) on said first printed circuit board (20) with said base portion through-bores (82) in alignment with said first array of contact pads (24);

a plurality of coaxial cable subassemblies (30) each terminated at both ends with a respective coaxial contact assembly (34, 38), the contact assemblies (34) at the first ends (32) of said cable subassemblies (30) each being disposed in a respective one of said base portion through-bores (82) and in contact with a respective one of said first plurality of contact pads (24), and the second ends (36) of said cable subassemblies (30) each being disposed in a respective slot (86) aligned with the line of the second set (60) of lines corresponding to the through-bore (82) in which the contact assembly (34) at the first end (32) of that cable subassembly (30) is disposed;

a faceplate member (76) including a wall (98) formed with a plurality of apertures (100) arranged in a two dimensional array corresponding to the positions of the second cable subassembly ends (36) disposed in the slots (86) of the housing wall portion (84);

a cover member (78) including means (90) for holding the cable subassemblies (30); and means (106, 108, 110, 112, 114, 116) for securing said faceplate member (76) to said cover member (78) with said housing wall portion (84) therebetween so that the contact assemblies (38) at the second ends (36) of the cable subassemblies (30) extend through respective ones of the apertures (100) in the faceplate member wall (98);

said faceplate member (76) being formed with a shroud portion (102) extending from said faceplate member wall (98) in a direction away from said housing wall portion (84) and surrounding the contact assemblies (38) in the apertures (100) in the faceplate member wall (98), said shroud portion (102) being sized to surround the housing block (70) of the second printed circuit board connector (68) so that the contact assemblies (38) at the second ends (36) of the coaxial cable subassemblies (30) can matingly engage respective coaxial contact assemblies in the through-bores (72) of the housing block (70).

14. An assembly according to claim 13 wherein said faceplate member (76) is formed with a plurality of fingers (104) extending transverse to said faceplate member wall (98) and adapted to close the ends of said housing wall portion slots (86).

15. An assembly according to claim 13 wherein said cover member holding means (90) includes a substantially planar wall (90) transverse to said housing wall portion (84) and formed with a plurality of open ended slots (92) aligned with lines in the second set (60) of lines corresponding to the through-bores (82) in the housing base portion (80).

16. An assembly according to claim 15 wherein said cover member wall (90) is formed with a plurality of ribs (94) parallel to said slots (92), with at least one of said ribs (94) being disposed between every adjacent pair of said slots (92).

17. An assembly according to claim 13 wherein the width of each of said slots (92) is less than the diameter of said through-bores (82) and greater than the diameter of said cable subassemblies (30).

18. An assembly according to claim 13 wherein said securing means includes flanges (106, 108) formed on the faceplate member (76) and the cover member (78), and means (110, 112, 114, 116) for clamping the flanges (106, 108) to each other.

19. An assembly according to claim 18 wherein said clamping means includes aligned openings (110, 112) in the flanges (106, 108) and fasteners (114) extending through said aligned openings (110, 112).

20. An assembly according to claim 13 wherein said first (58) and second (60) sets of lines are substantially orthogonal to each other.

21. An assembly according to claim 13 wherein said third (62) and fourth (64) sets of lines are substantially orthogonal to each other.

22. An assembly according to claim 13 wherein said first (58) and second (60) sets of lines are substantially orthogonal to each other and said third (62) and fourth (64) sets of lines are substantially orthogonal to each other.

* * * * *

UNITED STATES PATENT OFFICE
CERTIFICATE OF CORRECTION

Patent No. 4,900,258 Dated February 13, 1990

Inventor(s) Robert J. Hnatuck, Thomas S. Cohen, Dimitry G. Grabbe

It is certified that error appears in the above-identified patent and that said Letters Patent is hereby corrected as shown below:

Claim 1, column 7, line 16, the word "throughbores" should be --through-bores--.

Claim 17, column 10, line 18, "claim 13" should be --claim 15--.

Signed and Sealed this

Sixteenth Day of April, 1991

*Attest:*

HARRY F. MANBECK, JR.

*Attesting Officer* *Commissioner of Patents and Trademarks*